United States Patent [19]

Buffet

[11] 4,297,849

[45] Nov. 3, 1981

[54] HEAT EXCHANGERS FOR THERMO-ELECTRIC INSTALLATIONS COMPRISING THERMO-ELEMENTS

[75] Inventor: Jean Buffet, Paris, France

[73] Assignee: Air Industrie, Courbevoie, France

[21] Appl. No.: 51,132

[22] Filed: Jun. 22, 1979

[51] Int. Cl.³ .............................................. F25B 21/02
[52] U.S. Cl. .......................................................... 62/3
[58] Field of Search .............. 165/185; 62/3; 136/203, 136/204

[56] References Cited

U.S. PATENT DOCUMENTS

| | | | |
|---|---|---|---|
| 2,892,618 | 6/1959 | Holm | 165/185 |
| 2,973,627 | 3/1961 | Lackey et al. | 136/204 |
| 3,090,207 | 5/1963 | Smith et al. | 62/3 |
| 3,095,709 | 7/1963 | Demand | 62/3 |
| 3,326,726 | 6/1967 | Bassett, Jr. et al. | 136/203 |
| 3,902,923 | 9/1975 | Evans | 62/3 X |

FOREIGN PATENT DOCUMENTS 241658 11/1962 Australia ................................. 62/3
2316557 1/1977 France ..................................... 62/3

OTHER PUBLICATIONS

IBM-Technical Disclosure Bulletin *Thermoelectric Cooling*. J. H. Seely, vol. 11, No. 7, Dec. 1968–pp. 834–839.

*Primary Examiner*—Lloyd L. King
*Attorney, Agent, or Firm*—Larson and Taylor

[57] ABSTRACT

A heat exchanger for a thermo-electric installation, comprising thermo-elements mounted between a hot wall and a cold wall, including, on the one hand, two base plates each forming or supporting a hot or cold wall and, on the other hand, a plurality of heat exchange surfaces extending between these two base plates. Each heat exchange surface is formed by an homogeneous one-piece bar.

18 Claims, 10 Drawing Figures

HEAT EXCHANGERS FOR THERMO-ELECTRIC INSTALLATIONS COMPRISING THERMO-ELEMENTS

The invention relates generally to heat exchangers for thermo-electric installations comprising thermo-elements mounted between two heat exchange walls, i.e. a hot wall and a cold wall.

The invention relates also to thermo-electric installations comprising a plurality of heat exchangers according to the invention.

Such installations may be used to generate a DC electric current when the hot and cold walls are maintained at different temperatures or, on the contrary, to maintain the hot and cold walls at different temperatures when a DC electric current flows through the thermo-elements, this electric current being able to be fed to said thermo-elements by heat exchangers of which the heat exchange walls form part.

The invention applies more particularly, but not exclusively, to heat exchangers for these latter types of installation, the thermo-elements being fed with DC electric current to maintain a temperature difference between two hot and cold walls. Such an installation, called "heat pump", may be used to produce "hot" or "cold". In fact, the thermo-elements are of two types, i.e. thermo-elements of type P which transfer heat in the direction of the current, and thermo-elements of type N which transfer heat in the reverse direction of the current.

For the construction of such installations, it has already been proposed to provide them with heat exchangers each comprising at least one base plate cooperating, on one side, with at least one thermo-element and, on the other side, with heat exchange surface bathed with a hot fluid or a cold fluid.

It has already been proposed to construct these heat exchange surfaces by means of a plurality of fins, which presented a number of disadvantages.

Cleaning is difficult because the fins are close to one another and are of small thickness, so fragile (practical impossibility of cleaning with pressurized water jet); moreover, the condensation water is retained by capillarity, which causes a considerable release of vapour when reversing the current in the thermo-elements.

It is also known to construct these heat exchange surfaces by means of a plurality of arms extending from a central region which may be disposed in different ways in relation to the base plate with which said central region is integral.

However, it has proved that the construction of such heat exchange surfaces was difficult and costly.

In particular, a question is posed concerning the homogeneity of the material forming the arms.

In fact, when a pressure moulding manufacturing process is used (which seems to be the only valid process), it is noted that the arms are in the form of an almost porous material, at least from the microscopic point of view.

It is then noted that the following problems are posed:

the length of the arms, whose coefficient of heat exchange by convection, related to the surface of the central region, is limited for constructional reasons;

the transmission of the electric current is considerably hampered by the porous nature of the arms;

the transmission of heat by conduction is also considerably hampered by the porous nature of the arms;

the compressing of the thermo-elements requires forces which are transmitted by the arms, and this compressing cannot be correctly achieved because of the low mechanical strength of the arms;

the form of the arms, imposed by a manufacturing process using foundry techniques (taper angle and rounded portions for connecting to the surface of the central region) contributes to an increase in weight of the heat exchange surfaces and affects adversely the flow of the condensed water.

The invention aims at resolving simultaneously the problems mentioned above, some of these problems not being moreover peculiar to the heat exchange surfaces formed by arms, but also being met with in heat exchange surfaces formed more conventionally by fins.

The heat exchanger of the invention comprises, on the one hand, two base plates each forming or supporting a hot or cold wall and, on the other hand, a plurality of heat exchange surfaces extending between these two base plates, and it is characterized by the fact that each heat exchange surface is formed by a solid bar made in one piece.

Preferably, each bar has a circular and possibly oval-shaped cross section.

The securing of the bar assembly to the two base plates may be achieved by crimping, rivetting or by a combined crimping and rivetting operation.

The securing of the bar assembly to the two base plates may also be achieved by welding and/or brazing.

The heat exchanger thus constructed presents the following advantages:

the one-piece solid cylindrical bars may have practically any length, allowing high convection heat exchange coefficients related to the surface of the two base plates to be obtained;

the transmission of the electric current is effected with a minimum voltage drop, because the material used for the bars may be formed by a metal, so very homogeneous;

the transmission of heat by conduction is effected along paths presenting the minimum of thermal resistance;

the bar assembly of each heat exchanger allows efficient compressing of the thermo-elements without risk of mechanical damage to the exchangers and this, for example, by means of a central tie-bolt;

the arrangement of the heat exchangers in the battery, so that the base plates are vertical and the bars horizontal, makes for a ready flow of the condensation water retained;

because of the cylindrical form of the bars and their attachment to the base plates, attachment which is free from roughnesses, the fouling up of the heat exchange surfaces is very limited;

because of the cylindrical shape of the bars, of the absence of roughnesses at the attachment of said bars and because of the strength of the exchanger, it is possible to clean the exchangers by fluid means under an efficient pressure;

the exchanger may be constructed with an optimization of its weight.

However, the means for attaching the bars to the two base plates are of the individual type, i.e. that each bar has its own attachment means (crimping, rivetting, crimping and rivetting, welding or brazing).

This solution may be further improved particularly insofar as the manufacture of the exchangers is concerned.

Other arrangements of the invention have as their aim an heat exchanger in which the means for attaching the bars are not individual and thus facilitate manufacture thereof.

According to one of these arrangements, each heat exchange surface is formed by an array of bars connecting two side strips, continuous or discontinuous, for fixing on the two base plates.

Each bar may be formed, in cross section, by a flat portion and a curved portion extending outside the plane defined by the two side strips. But each bar may also be formed, in cross section, by a central portion bordered by two curved portions extending on the same side outside the plane defined by the two side strips.

Insofar as the disposition of the heat exchange surfaces is concerned, it should be emphasized that it may be such that, either adjacent heat exchange surfaces are disposed in relation to each other so that their bars are at right angles to each other, or adjacent heat exchange surfaces are disposed in relation to each other so that their bars are staggered in relation to each other.

From the manufacturing point of view, it is advantageous to make each heat exchange surface from a flat plate in which a central zone, leaving the two side strips existing, is subjected to an operation consisting in forming the bars by cutting out and pushing out the material situated between the bars, and this without removing said material, or at least with a minimum removal of material.

The additional advantages provided by the arrangement discussed above are given below:

the attachment of the bars by means of side bands allows rapid manufacture, inexpensive, and automated to a great extent.

the heat exchanges are further promoted by an increase in the convection coefficient related to the surface of the base plate, this increase being caused by high turbulence, the removal of the water of condensation is further facilitated by a downward suction effect, due to the local increases of the speed of the fluid, the use of laminated or drawn metals or alloys for forming the heat exchange surfaces, these laminated or drawn materials presenting higher thermal conductivity properties than those of cast materials, the use of less expensive metals or alloys than metals or alloys for extruding, the possibility of manufacturing the heat exchange surfaces from a thick material, which leads to bars of large section, and so to exchangers having advantageous mechanical properties; these properties allow, on the one hand, piles of exchangers to be subjected to high compression stresses without risk of the bars collapsing and, on the other hand, the heat exchange surfaces to be cleaned by pressurized water jets without risk of damaging the bars, the manufacture of the heat exchange surfaces is carried out without removing material, so without waste.

The invention will, in any case, be well understood with the help of the complement of description which follows, as well as the accompanying drawings, which complement and drawings relate to preferred embodiments of the invention and comprise, of course, no limiting character.

FIG. 1 of these drawings is a perspective view of a heat exchanger constructed in accordance with a first embodiment of the invention and shown placed on one of its two base plates, some of the cylindrical bars being cut away for a better understanding of this figure.

Figure 1:
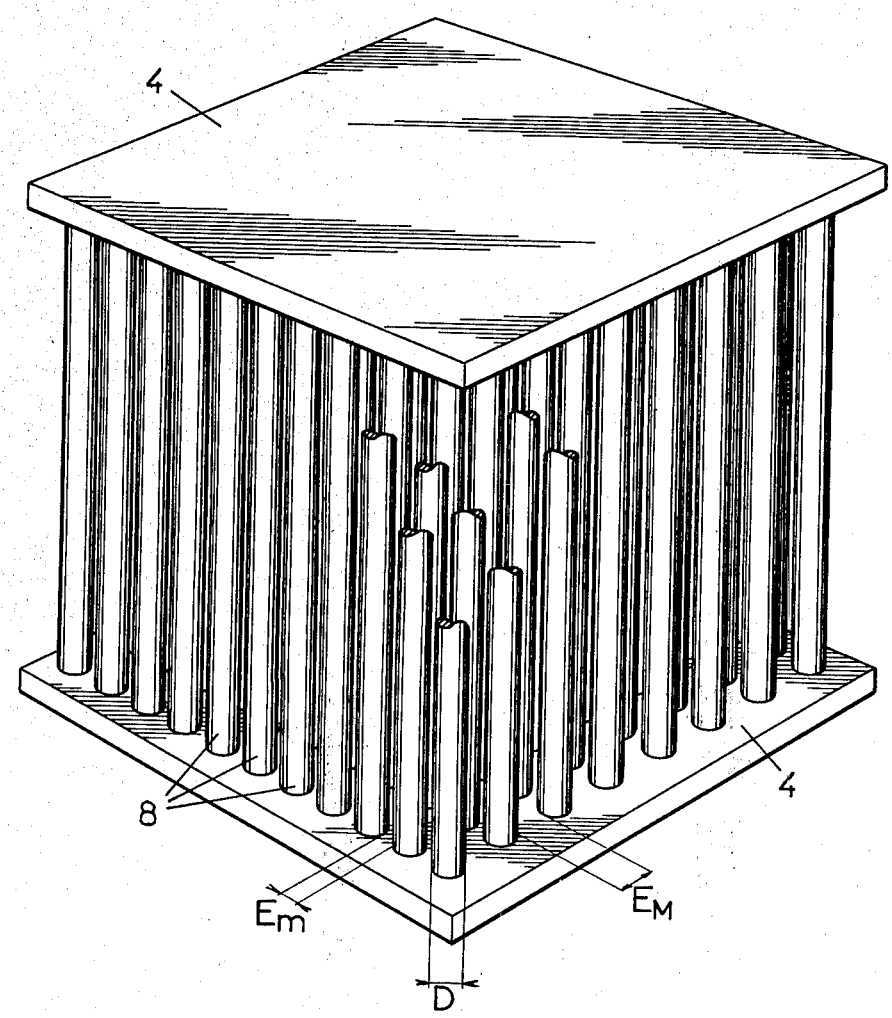
Figure 2:
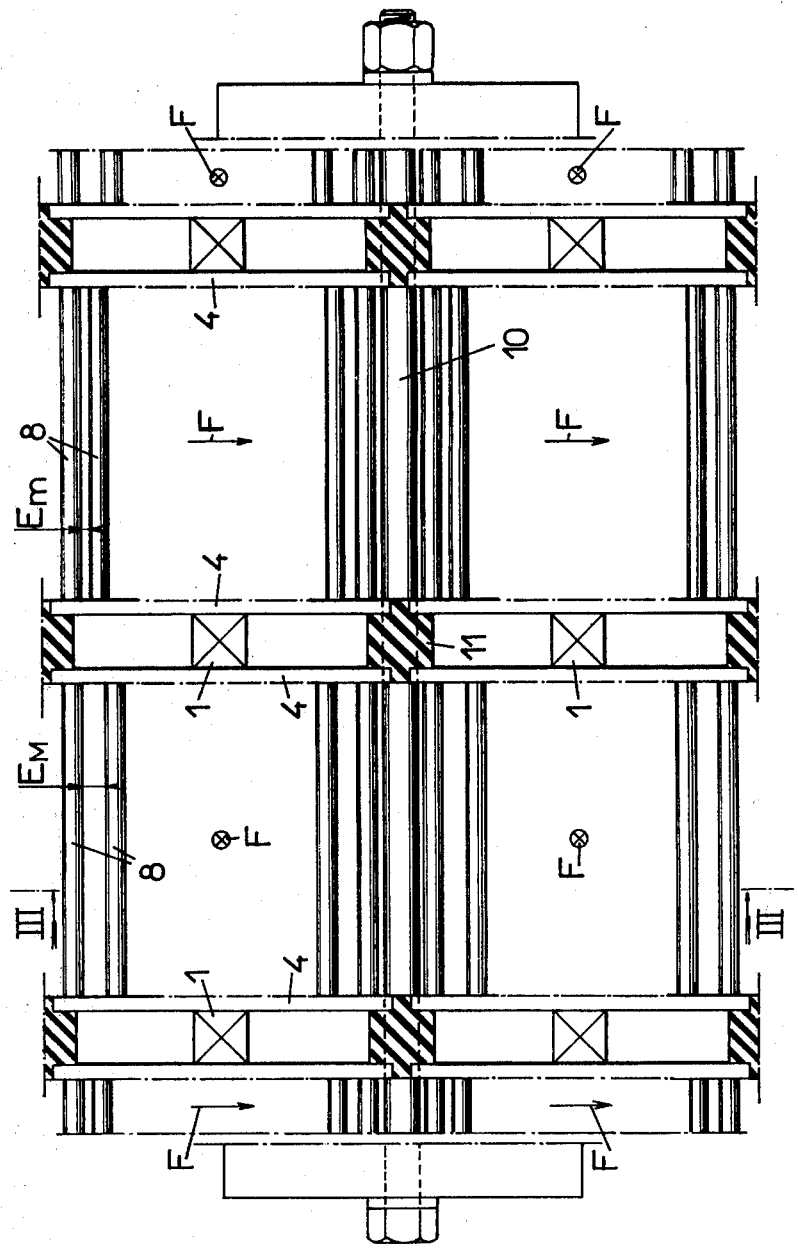
FIG. 2 shows schematically in fragmentary section a thermo-electric installation constructed with heat exchangers in accordance with the invention.
Figure 3:
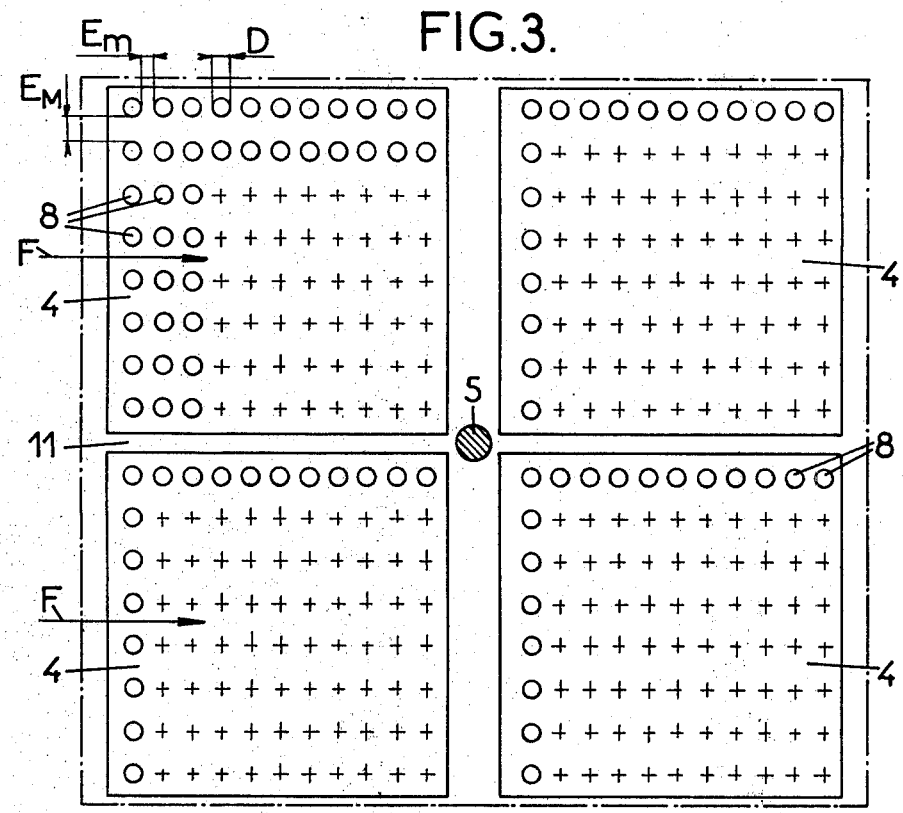
FIG. 3 is a schematic section along III—III of FIG. 2.

As shown in FIGS. 1 to 3, the heat exchanger comprises essentially two base plates 4 disposed in parallel and connected by a plurality of bars 8 which are cylindrical, solid, made in one piece and distributed, for example, in lines and columns.

The fixing of these bars 8 to the two base plates 4 is preferably carried out with crimping, rivetting, crimping and rivetting, brazing or welding attachment means.

Such attachments allow a simple construction of the heat exchanger, which may be accomplished by a succession automatic operations.

Moreover, these attachments allow a good transmission of the current and of the heat.

Moreover, the bars 8 may be given practically any length, which allows particularly high heat exchange coefficients by convection, related to the surface of the two base plates, to be obtained and in any case substantially higher than the convection heat exchangers which may be attained with conventional heat exchangers of the "barb" type, i.e. comprising arms extending from a central region integral with the base plate.

The heat exchanger thus constructed ensures a good transmission of the electric current and a good transmission of the heat by conduction because, on the one hand, of the means for attaching the two ends of each bar respectively to the two base plates and, in the other hand, because of the fact that each bar is homogenous and in one piece which may be provided by sectioning a drawn or extruded metal wire.

Moreover, the heat exchanger thus constructed presents an excellent compression strength, which allows efficient compressing of each thermo-element.

The structure of a heat exchanger in accordance with the invention allows ready flow of the condensation water retained when the base plates are orientated vertically.

The absence of roughnesses along the bars as well as at the attachment of their two ends respectively to the two base plates, and the absence of rounded portions for connecting to the surface of the two base plates, promote this flow, limit the fouling up of the heat exchange surfaces and allow them to be cleaned by fluid jets (particularly hot water jets) fed into the heat exchangers under an efficient pressure.

Finally, it will be readily understood that it is easy to arrive by calculation at an optimization of the weight of each heat exchanger, the dimensions (particularly the diameter, the length and the pitch of the bars) revealed by the calculation not generally forming an obstacle to the manufacture of the heat exchanger.

Such being the case, it should be pointed out that the bars are disposed, when the two base plates are vertical, so that successive bars, situated in a plane perpendicular to the fluid flow, are spaced apart by a transverse pitch greater than the longitudinal pitch of the successive bars situated in a plane parallel to the fluid flow.

The minimum spacing $E_m$ between bars is such that the condensed water is not retained by capillarity.

The maximum spacing $E_M$ between bars is such that the exchange surface is the largest possible for a pressure drop as low as possible.

In fact, calculation and experience show that an arrangement satisfying the equation $d = \sqrt{E_m \times E_M}$ gives excellent results, D designating the diameter of the bars.

By way of example, it can be mentioned that the applicant has constructed and tested heat exchangers having the following characteristics:
 square base plates of 58 mm×58 mm,
 thickness of each base plate: 3 mm,
 minimum spacing between bars: 2 mm,
 maximum spacing between bars: 4.5 mm,
 diameter of the bars: 3 mm,
 length of the bars: 60 mm.

The thermo-electric installation schematically shown in FIGS. 2 and 3 (in which the same reference figures designate the same parts as in FIG. 1) comprises a pile of heat exchangers of the type shown in FIG. 1, whose base plates 4 are disposed vertically.

The thermo-elements 1 are compressed between two facing base plates 4, by means for example of a central tie-bolt 10.

Appropriate seals 11 are disposed between the vertical layers formed by the heat exchangers.

The hot and cold fluids may flow in the direction indicated by arrows F, i.e. according to crossed currents.

Other flow directions could, of course, be contemplated.

Figure 4:
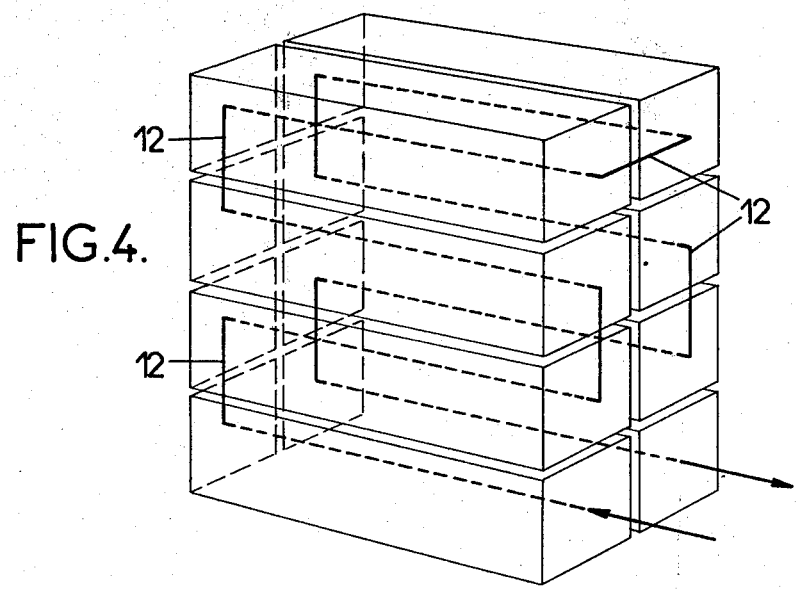
FIG. 4 is a schematic perspective view showing the electrical circuit of a thermo-electric installation constructed with heat exchangers in accordance with the invention.

In such a thermo-electric installation, the electrical circuit may be constructed in a particularly simple way for each file formed by a succession heat exchangers is connected in series, lateral connections 12 allowing passage from one pile to the other (FIG. 4).

Figure 5:
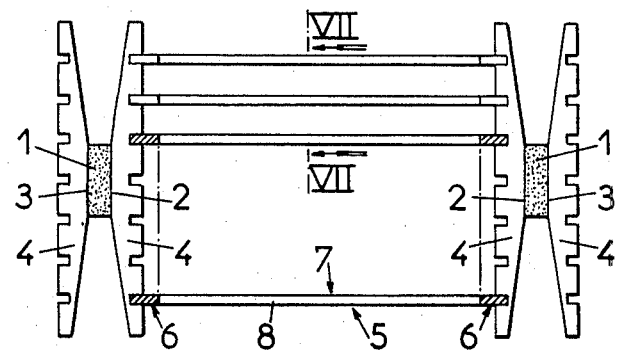
FIG. 5 shows in section a heat exchanger constructed in accordance with another embodiment of the invention.

In FIG. 5, there is shown, in section, a heat exchanger for a thermo-electric installation. This installation comprises thermo-elements 1, mounted between two heat exchange walls, i.e. a hot wall 2 and a cold wall 3.

As mentioned above, this exchanger comprises two base plates 4 each forming or supporting a hot wall 2 or cold wall 3 of the installation.

These two base plates 4 are disposed in parallel and they are interconnected by a plurality of heat exchange surfaces 5.

Figure 6:
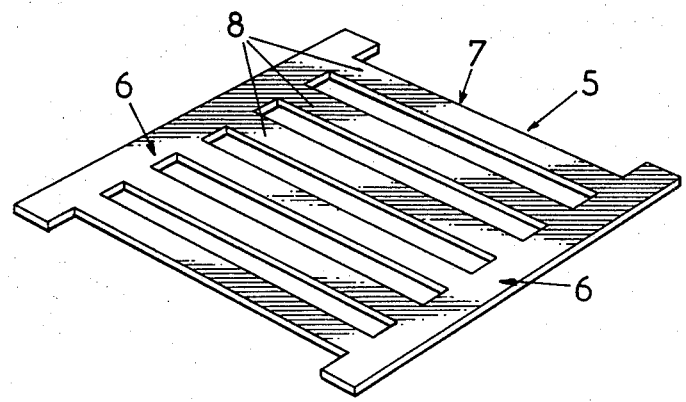
FIG. 6 is a perspective view of a heat exchange surface of the exchanger shown in FIG. 5.
Figure 7:
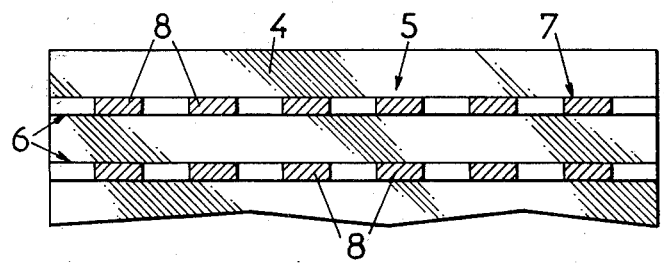
FIG. 7 is a partial section along VII—VII of FIG. 5.

Each heat exchange surface 5 is formed, as shown in FIGS. 5 to 7, by
 two side strips 6, continuous or discontinuous, for fixing to the two base plates 4,
 and a central zone 7 formed by an array of bars 8 interconnecting the two said side strips 6.

It will be understood that the connecting of bars 8 with the two base plates 4 is no longer a problem of individual attachment since this attachment takes place through the two side bands 6.

The attachment of these two side bands 6, respectively to the two base plates, i.e. two fixing operations, ensures the positioning of as many bars 8 as the heat exchange surface 5 comprises.

This securing of the two side bands 6 may be obtained by embedding and/or crimping and/or brazing and/or welding.

It is moreover possible to give the two side bands 6 a rectilinear form, which facilitates their attachment. For this purpose, there may be provided, in each base plate 4, grooves 9 for receiving said side bands 6.

Taking into account the fact that the connecting of bars 8 takes place through the two side bands 6, it is possible to give bars 8 various forms which may be chosen so as to promote heat exchanges and/or to facilitate the discharge of the condensation water.

Figure 8:
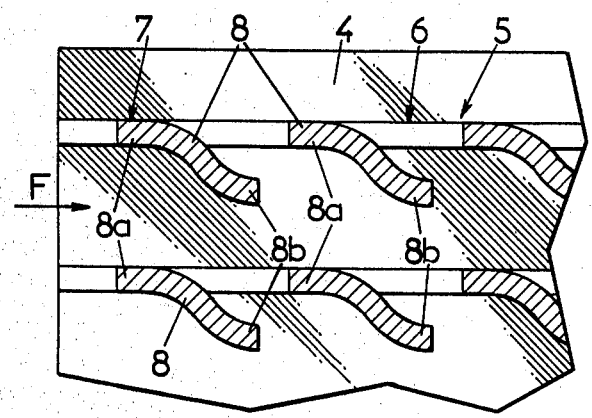
FIGS. 8 to 10 show partial sections similar to that of FIG. 7 but on a larger scale, each of the three figures showing three further advantageous embodiments of the invention.

According to the embodiment illustrated in FIG. 8, each bar 8 is formed, in cross section, by a flat portion 8a and a curved portion 8b extending outside the plane defined by the two side bands 6.

In relation to the flow direction of the fluid, indicated by arrow F, the flat portion 8a is upstream of curved portion 8b.

With this arrangement, heat exchanges are promoted by increasing the convection coefficient by the turbulences causes by the curved portions 8b of bars. 8.

When the heat exchanger is disposed so that the two base plates 4 are vertical and the heat exchange surfaces 5 are horizontal, curved portions 8b are advantageously disposed below flat portions 8a.

The discharge of the condensation water is then facilitated; in fact, the curved portions 8b of bars 8 create a local increase in the speed of the fluid flowing through the exchanger and, accordingly, a depression which draws the drops of water downwards.

Figure 9:
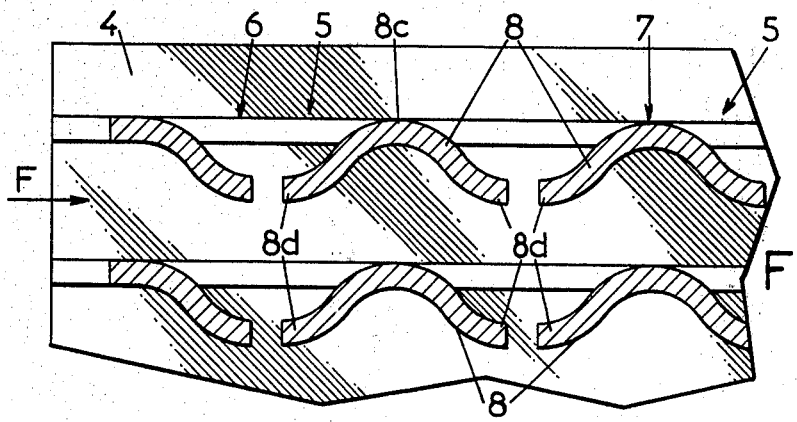
Figure 10:
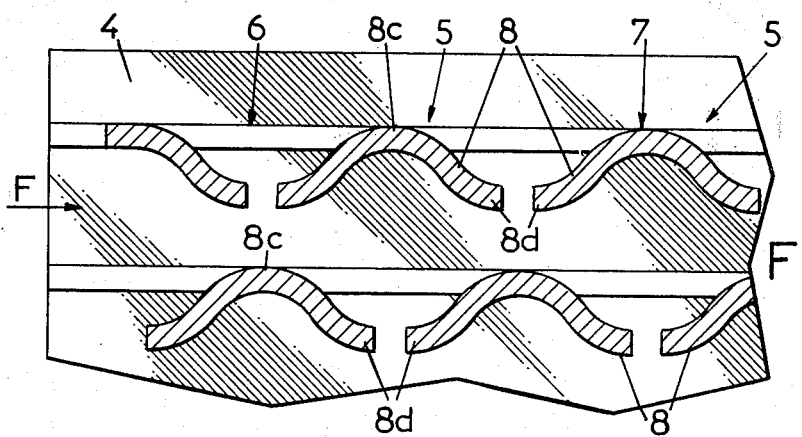

According to the two embodiments illustrated in FIGS. 9 and 10, each bar 8 is formed, in cross section, by a central portion 8c bordered by two curved portions 8d extending on the same side outside the plane defined by the two side bands 6.

In relation to the fluid flow direction, indicated by arrow F, heat exchange surfaces 5 thus constructed may be equally in one direction or in the other.

As in the preceding embodiment, heat exchanges are promoted by increasing the convection coefficient by the turbulences caused by the curved portions 8d of bars 8.

When the heat exchanger is disposed so that the two base plates 4 are vertical and the heat exchange surfaces 5 are horizontal, the curved portions 8d are advantageously disposed below central portion 8c.

The discharge of the condensation water is then facilitated by the dished shape which is defined by the two curved portions 8d belonging respectively to two successive bars 8.

In accordance with the embodiment shown in FIG. 9, adjacent heat exchange surfaces 5 are disposed in relation to each other so that their bars 8 are at right angles to each other.

According to the embodiment illustrated in FIG. 10, adjacent heat exchange surfaces 5 are disposed in relation to each other so that their bars 8 are staggered in relation to each other.

The arrangement of this latter embodiment further facilitates the discharge of the condensation water for the water which has collected in the dish formed by two successive bars 8 is drawn by the depression which reigns therebelow, this depression being caused by the speeding up of the fluid in the neck formed by the bar 8 disposed below said dish.

From the constructional point of view, it is advantageous, for the embodiments shown in FIGS. 8 to 10, to have recourse to a means of manufacturing each heat exchange surface 5 which consists in forming the bars by cutting out and pushing out the material situated between the bars, and this without removal of said material.

Thus, heat exchangers may be obtained for low manufacturing costs, not only insofar as the speed of construction of the heat exchange surfaces 5 is concerned, but also insofar as the saving in material forming said heat exchange surfaces 5 is concerned, this material being relatively expensive since it must be a good conductor of heat and electricity.

Recourse may also be had, as shown in FIG. 6, to heat exchange surfaces 5 whose bars 8 have a square or rectangular shape. Under these circumstances, these bars 8 may be formed by stamping a flat plate.

I claim:

1. A heat exchanger for a thermo-electric installation comprising thermo-elements mounted between a hot wall and a cold wall, said heat exchanger including two base plates thermally contacting said hot or said cold wall and a plurality of heat exchange surfaces extending between said two base plates, each of said heat exchange surfaces being constituted by an array of homogeneous one-piece bars, said bars being firstly disposed and spaced apart in a first plurality of planes perpendicular to the direction of fluid flow and secondly disposed and spaced apart in a second plurality of planes parallel to the direction of fluid flow.

2. The heat exchanger as claimed in claim 1, wherein the bars are cylindrical.

3. The heat exchanger as claimed in claim 1, wherein the bars are oval-shaped.

4. The heat exchanger as claimed in claim 1, wherein the bars situated in a plane perpendicular to the direction of fluid flow are spaced apart by a transverse pitch greater than the longitudinal pitch of the bars situated in a plane parallel to the direction of fluid flow.

5. The heat exchanger as claimed in claim 4 in which the fluid flow contains vapour water condensable below a critical temperature, wherein the surface of each bar is smooth and wherein the minimum spacing between the bars is such that water condensed from said vapour is not retained by capillarity, the maximum spacing between the bars being such that the heat exchange surface is the largest possible for a pressure loss as small as possible.

6. The heat exchanger as claimed in claim 5, wherein the diameter of the bars is equal to the square root of the product of the minimum spacing and the maximum spacing of said bars.

7. The heat exchanger as claimed in claim 1, wherein each one-piece bar of the array is connected together to two side strips for fixing to the two base plates.

8. The heat exchanger as claimed in claim 7, wherein the heat exchanger is disposed in the thermo-electric installation so that the two base plates are vertical, and so that the heat exchange surfaces are horizontal.

9. The heat exchanger as claimed in claim 8, wherein the cross section of each bar is constituted by a flat portion and by a curved portion extending outside the plane defined by the two side strips.

10. The heat exchanger as claimed in claim 8, wherein the cross section of each bar is constituted by a central portion bordered by two curved portions extending on the same side outside the plane defined by the two side strips.

11. The heat exchanger as claimed in claim 7, wherein adjacent heat exchange surfaces are disposed in relation to each other so that their bars are at right angles to each other.

12. The heat exchanger as claimed in claim 7, wherein adjacent heat exchange surfaces are disposed in relation to each other so that their bars are staggered in relation to each other.

13. The heat exchanger as claimed in claim 7, wherein each heat exchange surface is obtained from a flat plate in which a central zone comprises bars and cut outs between the bars, said bars including the material moved to form the cut outs without removal of said material.

14. The heat exchanger as claimed in claim 7, wherein the cross section of each bar is square shaped.

15. The heat exchanger as claimed in claim 7, wherein the cross section of each bar is rectangular shaped.

16. The heat exchanger as claimed in claim 14 or 15, wherein each exchange surface is obtained from a flat plate in which a central zone, leaving the two side strips existing, is subjected to a stamping operation.

17. A thermo-electric installation comprising a plurality of heat exchangers, each comprising: thermo-elements mounted between a hot wall and a cold wall; said heat exchanger including two base plates thermally contacting said hot wall or cold wall; and a plurality of heat exchange surfaces extending between said two base plates, each exchange surfaces being constituted by an array of homogeneous one-piece bars, said bars being firstly disposed and spaced apart in a first plurality of planes perpendicular to the direction of fluid flow and secondly disposed and spaced apart in a second plurality of planes parallel to the direction of fluid flow.

18. A thermo-electric installation as in claim 17, wherein each of the one-piece bars of the array are connected together to two side strips, for fixing to the two base plates.

* * * * *